United States Patent
Kim et al.

(10) Patent No.: US 12,169,678 B2
(45) Date of Patent: Dec. 17, 2024

(54) OPERATING METHOD OF ELECTRONIC DEVICE FOR SEMICONDUCTOR MEMORY MANUFACTURE

(71) Applicant: Samsung Electronics Co., Ltd., Suwon-si (KR)

(72) Inventors: Useong Kim, Hwaseong-si (KR); Bayram Yenikaya, San Jose, CA (US); Mindy Lee, San Jose, CA (US); Xin Zhou, San Jose, CA (US); Hee-Jun Lee, Seoul (KR); Woo-Yong Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 468 days.

(21) Appl. No.: 17/510,652

(22) Filed: Oct. 26, 2021

(65) Prior Publication Data

US 2023/0125680 A1  Apr. 27, 2023

(51) Int. Cl.
*G06F 30/398* (2020.01)
*G06V 10/44* (2022.01)
*G06V 10/88* (2022.01)

(52) U.S. Cl.
CPC ............ *G06F 30/398* (2020.01); *G06V 10/44* (2022.01); *G06V 10/88* (2022.01); *G06V 2201/06* (2022.01)

(58) Field of Classification Search
CPC ...... G06F 30/398; G06V 10/44; G06V 10/88; G06V 2201/06; G03F 1/36; G03F 1/70; G03F 7/70441
See application file for complete search history.

(56) References Cited

U.S. PATENT DOCUMENTS

| | | |
|---|---|---|
| 7,600,212 B2 | 10/2009 | Zach et al. |
| 7,698,665 B2 | 4/2010 | Abrams et al. |
| 7,703,049 B2 | 4/2010 | Abrams et al. |
| 7,784,019 B1 | 8/2010 | Zach |
| 8,735,297 B2 | 5/2014 | Kurjanowicz |
| 9,805,154 B2 * | 10/2017 | Ho .............. G03F 7/70441 |
| 10,671,786 B2 * | 6/2020 | Lai ..................... G03F 1/36 |
| 10,831,977 B1 * | 11/2020 | Gheith ................ G03F 1/36 |
| 10,877,380 B1 * | 12/2020 | Lin ..................... G03F 1/36 |
| 10,983,429 B1 | 4/2021 | Lin |
| 2005/0153217 A1 * | 7/2005 | Izuha ............ G03F 7/70441 |
| | | 430/5 |

(Continued)

OTHER PUBLICATIONS

Chris Spence et al., "Manufacturing challenges for curvilinear masks", Proc. SPIE 10451, Photomask Technology 2017, 1045104 (Oct. 16, 2017).

(Continued)

*Primary Examiner* — Nha T Nguyen
(74) *Attorney, Agent, or Firm* — Muir Patent Law, PLLC

(57) ABSTRACT

Disclosed is an operating method of an electronic device for manufacture of a semiconductor device. The operating method includes receiving a layout image of the semiconductor device, generating an intermediate image by generating assist features based on main features of the layout image, evaluating a process result by performing simulation based on the intermediate image, and correcting the intermediate image by correcting shapes of the main features and/or the assist features of the intermediate image based on the process result.

19 Claims, 10 Drawing Sheets

(56) References Cited

U.S. PATENT DOCUMENTS

| | | | | |
|---|---|---|---|---|
| 2005/0257187 A1* | 11/2005 | Gallatin | ............... | G03F 1/70 |
| | | | | 716/53 |
| 2014/0189614 A1* | 7/2014 | Liu | ............... | G03F 1/70 |
| | | | | 716/55 |
| 2015/0113486 A1* | 4/2015 | Wang | ............... | G06F 30/398 |
| | | | | 716/53 |
| 2016/0335385 A1* | 11/2016 | Ho | ............... | G03F 7/70441 |
| 2018/0074393 A1* | 3/2018 | Pang | ............... | G03F 1/36 |
| 2021/0048753 A1* | 2/2021 | Zhang | ............... | G03F 7/70441 |
| 2021/0072637 A1 | 3/2021 | Yeo et al. | | |
| 2021/0191254 A1 | 6/2021 | Huang et al. | | |
| 2022/0100079 A1* | 3/2022 | Zhang | ............... | G06F 30/398 |
| 2022/0299884 A1* | 9/2022 | Trivedi | ............... | G03F 1/36 |

OTHER PUBLICATIONS

G. Allaire, G. Dapogny, F, Jouve, "Shape and topology optimization", hal-02496063 (2020) ) computational lithography.
https://pages.mtu.edu/~shene/COURSES/cs3621/NOTES/spline/B-spline/bspline-curve-closed.html, retrieved on Oct. 20, 2021.

* cited by examiner

OPERATING METHOD OF ELECTRONIC DEVICE FOR SEMICONDUCTOR MEMORY MANUFACTURE

BACKGROUND

Embodiments of the present disclosure described herein relate to an operating method of an electronic device, and more particularly, relate to an operating method of an electronic device for the manufacture of a semiconductor device preventing a defect without post-processing in optical proximity correction (OPC).

Optical proximity correction (OPC) may in advance correct that shapes of generated mask patterns differ from shapes of target mask patterns due to process characteristics or process errors during a photolithography process. During the optical proximity correction, shapes of photomask patterns to be used for a process may be corrected differently from those of the target mask patterns, such that the shapes of the generated mask patterns coincide with the target mask patterns.

Various defects may occur during the optical proximity correction. The defects occurring during the optical proximity correction may make a photomask obtained through the optical proximity correction unusable. When a photomask is unusable, the time and costs used for the optical proximity correction may be irrecoverable.

SUMMARY

Embodiments of the present disclosure provide a device and a method capable of performing optical proximity correction preventing defects from occurring.

According to an embodiment, an operating method of an electronic device for manufacture of a semiconductor device includes receiving a layout image of the semiconductor device, generating an intermediate image by generating assist features based on main features of the layout image, evaluating a process result by performing simulation based on the intermediate image, and correcting the intermediate image by correcting shapes of the main features and/or the assist features of the intermediate image based on the process result.

According to an embodiment, an operating method of an electronic device for manufacture of a semiconductor device includes calculating a change in a target slope of a change in the intensity of light to a change in a photoresist image, based on simulation and an evaluation result based on a layout image including main features and assist features, from a target slope of a change in the intensity of light at a boundary line of each of the main features, calculating a change in a target slope of a change in the intensity of light to a change in an optical image, from the change in the target slope of the change in the intensity of light to the change in the photoresist image, calculating a change in a target slope of a change in the intensity of light to a change in a mask image, from the change in the target slope of the change in the intensity of light to the change in the optical image, calculating a change in a target slope of a change in the intensity of light to a change in a curvilinear shape image, from the change in the target slope of the change in the intensity of light to the change in the mask image, and calculating correction information of the intermediate image, from the change in the target slope of the change in the intensity of light to the change in the curvilinear shape image.

According to an embodiment, an operating method of an electronic device for manufacture of a semiconductor device includes receiving a layout image of the semiconductor device, generating an intermediate image by generating assist features based on main features of the layout image, generating a curvilinear shape image from the intermediate image, generating a mask image by pixelating the curvilinear shape image, generating an optical image by performing optical simulation on the mask image, generating a photoresist image by performing photoresist simulation on the optical image, calculating a slope of a change in the intensity of light at a boundary line of each of the main features, calculating a change in a target slope of a change in the intensity of light to a change in a photoresist image, from a target slope of a change in the intensity of light at the boundary line of each of the main features, calculating a change in a target slope of a change in the intensity of light to a change in an optical image, from the change in the target slope of the change in the intensity of light to the change in the photoresist image, calculating a change in a target slope of a change in the intensity of light to a change in a mask image, from the change in the target slope of the change in the intensity of light to the change in the optical image, calculating a change in a target slope of a change in the intensity of light to a change in a curvilinear shape image, from the change in the target slope of the change in the intensity of light to the change in the mask image, and calculating correction information of the intermediate image, from the change in the target slope of the change in the intensity of light to the change in the curvilinear shape image.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that an ordinary one in the art easily implements the present disclosure. Below, the term "and/or" is interpreted as including any one of items listed with regard to the term, or a combination of some of the listed items.

Figure 1:
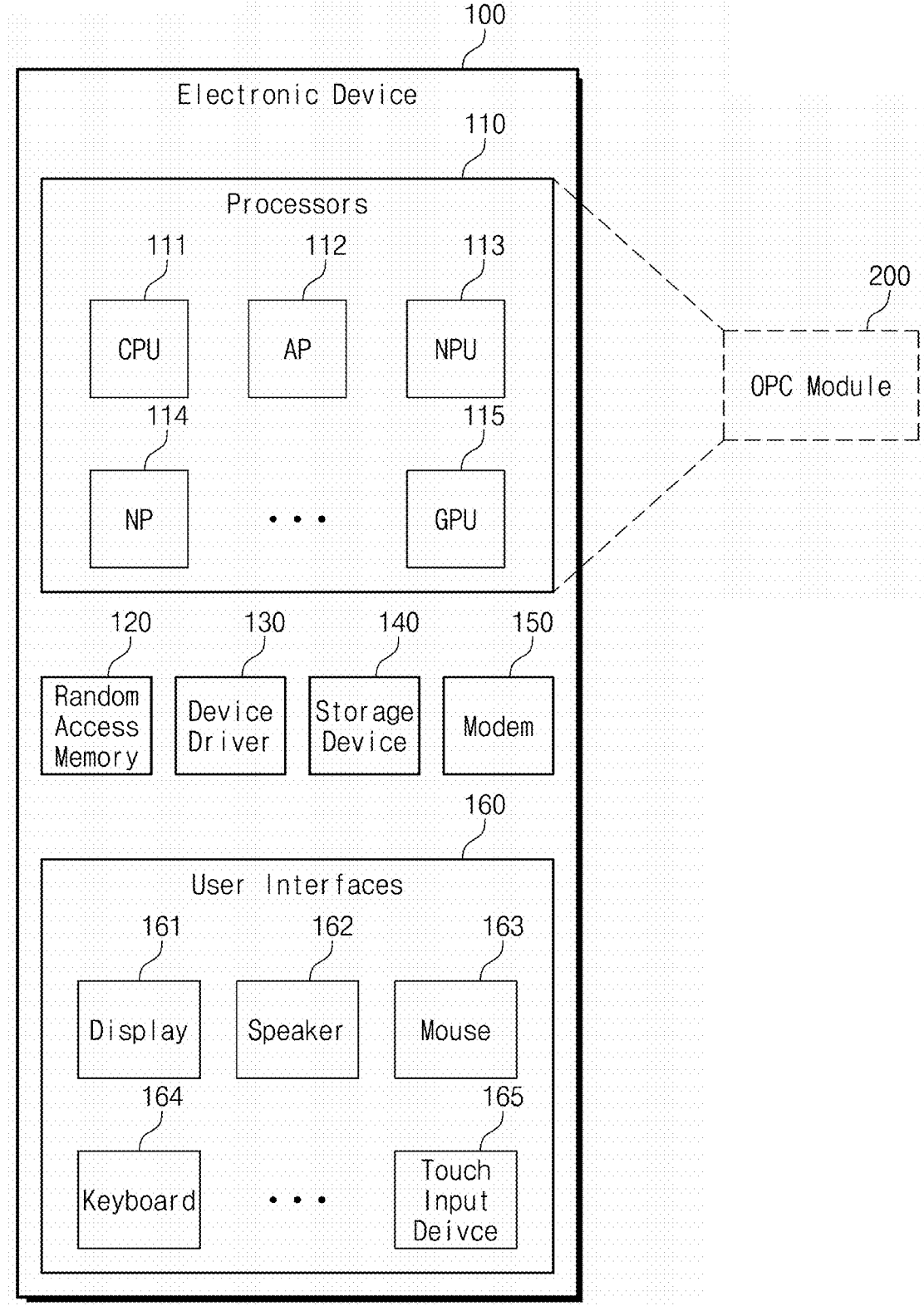
FIG. 1 is a block diagram illustrating an electronic device according to an embodiment of the present disclosure.

FIG. 1 is a block diagram illustrating an electronic device 100 according to an embodiment of the present disclosure. Referring to FIG. 1, the electronic device 100 may include processors 110, a random access memory 120, a device driver 130, a storage device 140, a modem 150, and user interfaces 160.

The processors 110 may include, for example, at least one general-purpose processor such as a central processing unit (CPU) 111 or an application processor (AP) 112. Also, the processors 110 may further include at least one special-purpose processor such as a neural processing unit (NPU) 113, a neuromorphic processor 114, or a graphics processing unit (GPU) 115. The processors 110 may include two or more homogeneous processors.

At least one of the processors 110 may drive an optical proximity correction (OPC) module 200. For example, the OPC module 200 may be implemented in the form of instructions (or codes) that are executed by at least one of the processors 110. In this case, the at least one processor may load the instructions (or codes) of the OPC module 200 onto the random access memory 120.

For another example, at least one (or at least another) processor of the processors 110 may be manufactured to implement the OPC module 200. For example, at least one processor may be a dedicated processor that implements functions of the OPC module 200 hardwarely.

The random access memory 120 may be used as a working memory of the processors 110 and may be used as a main memory or a system memory of the electronic device 100. The random access memory 120 may include a volatile memory such as a dynamic random access memory or a static random access memory or a nonvolatile memory such as a phase-change random access memory, a ferroelectric random access memory, a magnetic random access memory, or a resistive random access memory.

The device driver 130 may control the following peripheral devices depending on a request of the processors 110: the storage device 140, the modem 150, and the user interfaces 160. The storage device 140 may include a stationary storage device such as a hard disk drive or a solid state drive, or a removable storage device such as an external hard disk drive, an external solid state drive, or a removable memory card.

The modem 150 may provide remote communication with an external device. The modem 150 may perform wired or wireless communication with the external device. The modem 150 may communicate with the external device based on at least one of various communication schemes such as Ethernet, wireless-fidelity (Wi-Fi), long term evolution (LTE), and 5G mobile communication.

The user interfaces 160 may receive information from a user and may provide information to the user. The user interfaces 160 may include at least one user output interface such as a display 161 or a speaker 162, and at least one user input interface such as a mouse 163, a keyboard 164, or a touch input device 165.

The instructions (or codes) of the OPC module 200 may be received through the modem 150 and may be stored in the storage device 140. The instructions (or codes) of the OPC module 200 may be stored in a removable storage device, and the removable storage device may be connected with the electronic device 100. The instructions (or codes) of the OPC module 200 may be loaded and executed onto the random access memory 120 from the storage device 140.

Figure 2:
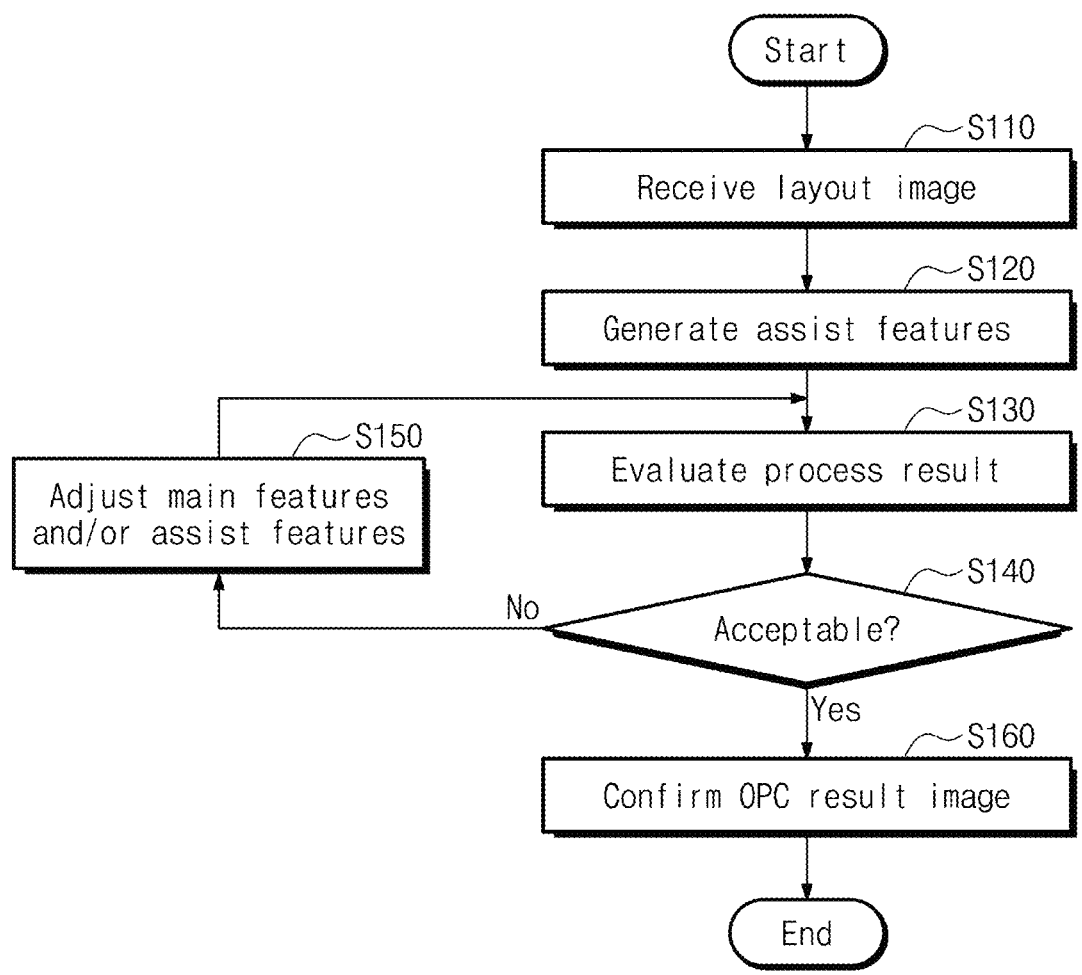
FIG. 2 illustrates an operating method of an electronic device according to an embodiment of the present disclosure.

FIG. 2 illustrates an operating method of the electronic device 100 according to an embodiment of the present disclosure. In an embodiment, an example in which the OPC module 200 performs OPC is illustrated in FIG. 2. Referring to FIGS. 1 and 2, in operation S110, the electronic device 100 or the OPC module 200 may receive a layout image. For example, the layout image may include target patterns to be formed on a semiconductor wafer, for example, semiconductor patterns, conductor patterns, or insulator patterns. The target patterns on the layout image may be referred as to "main features".

In operation S120, the electronic device 100 or the OPC module 200 may generate assist features from the layout image. The assist features may be used to assist the generation of the main features. A pattern may not be formed at a location of the semiconductor wafer, which corresponds to the assist features. The electronic device 100 or the OPC module 200 may generate an intermediate image by adding the assist features to the layout image. The intermediate image may be a shape image including shapes of the main features and shapes of the assist features. The intermediate image may be a candidate to be used as a photomask.

Figure 4:
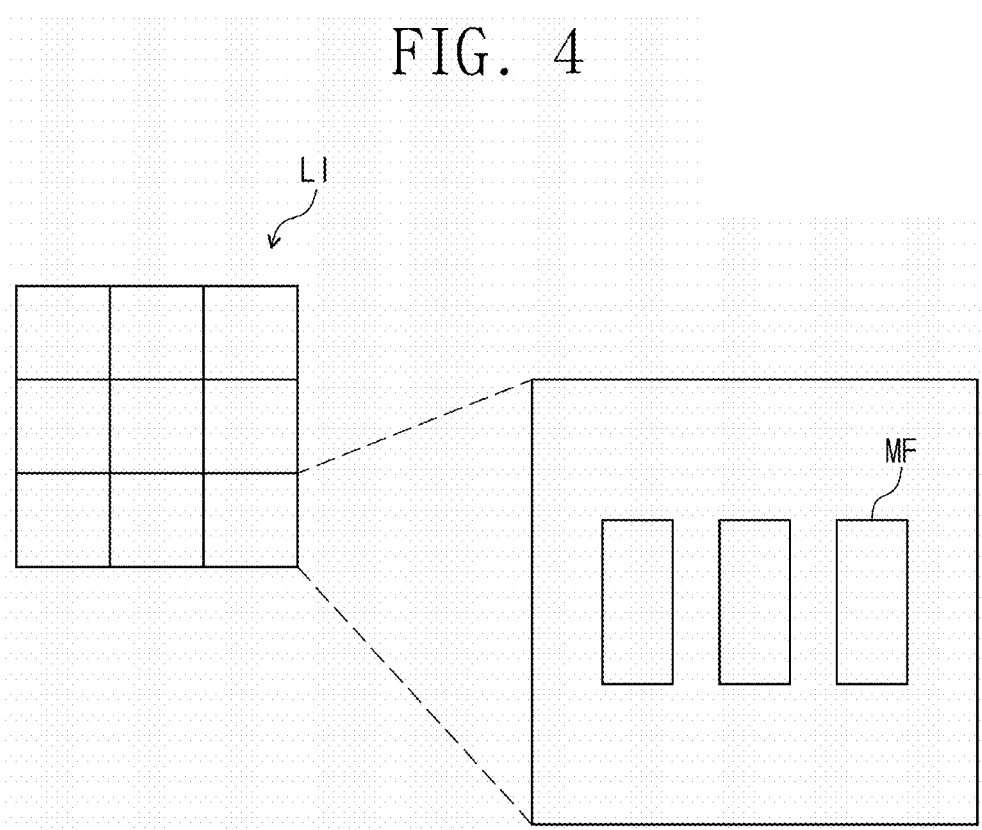
FIG. 4 shows an example of a layout image.
Figure 5:
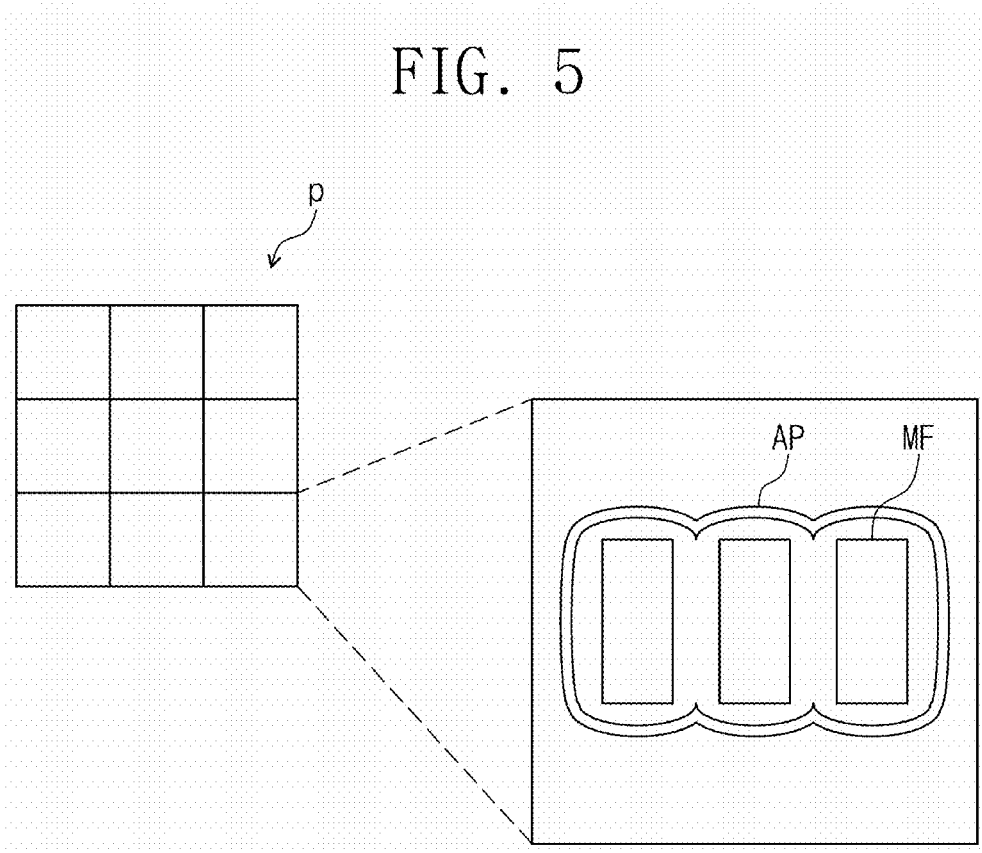
FIG. 5 illustrates an example of an intermediate image.

In an embodiment, an example of the layout image is illustrated in FIG. 4, and an example of the intermediate image is illustrated in FIG. 5. Referring to FIG. 4, a layout image LI may be divided into a plurality of areas, and each of the plurality of areas may include main features MF. The electronic device 100 or the OPC module 200 may perform OPC on each of the plurality of areas.

Referring to FIG. 5, an intermediate image "p" may be divided into a plurality of areas, and each of the plurality of areas may include the main features MF and assist features AF. The main features MF may correspond to a target pattern. The assist features AF may be added in a curvilinear shape surrounding the main features MF.

Referring again to FIGS. 1, 2, and 3, in operation S130, the electronic device 100 or the OPC module 200 may evaluate a process result. The electronic device 100 or the OPC module 200 may calculate a process result when a semiconductor manufacturing process is performed by using an intermediate image as a photomask, through a simulation.

In operation S140, the electronic device 100 or the OPC module 200 may determine whether the process result is acceptable. For example, through a simulation, the electronic device 100 or the OPC module 200 may calculate intensities of lights projected on the semiconductor wafer when the semiconductor manufacturing process is performed by using the intermediate image as a photomask. The electronic device 100 or the OPC module 200 may determine whether the intensities of lights projected on the semiconductor wafer are capable of generating patterns similar to the target patterns.

When the process result is not acceptable, in operation S150, the electronic device 100 or the OPC module 200 may correct the main features and/or the assist features of the intermediate image. For example, the electronic device 100 or the OPC module 200 may reversely perform the evaluation process in operation S130 to calculate at least one adjustment information of the main features and/or at least one adjustment information of the assist features. Afterwards, the electronic device 100 or the OPC module 200 may again perform operation S130 and operation S140.

When the process result is acceptable, in operation S160, the electronic device 100 or the OPC module 200 may confirm an OPC result image. For example, the electronic device 100 or the OPC module 200 may confirm a current intermediate image as an image of a photomask.

As described above, the electronic device 100 or the OPC module 200 according to an embodiment of the present disclosure may repeatedly perform simulation evaluation (e.g., a forward direction in operation S130) and correction of an intermediate image (e.g., a backward operation in operation S150) and may adjust an intermediate image being a candidate of a photomask.

The image correction of the OPC may be performed in a pixelated state. Image pixelation may include decreasing a resolution of an image for the purpose of reducing the complexity of computation. When the pixelated image is completely corrected, post-processing for increasing a resolution may be required.

A consistency defect that assist features of different shapes are generated when main features of the same shape are repeated may occur in the process of performing post-processing. A mask rule constraints (MRC) defect that assist features or main features incapable of be accepted in a semiconductor manufacturing process are generated may occur in the process of performing post-processing.

The OPC may be sequentially performed on a plurality of areas defined by dividing a semiconductor die. The post-processing for increasing a resolution may also be sequentially performed on the plurality of areas. A specific main feature may overlap at least two or more areas. A boundary defect that a boundary of a portion of a specific feature, which belongs to one area, is not matched with a boundary of a portion thereof, which belongs to another area may occur in the process of performing post-processing.

According to an embodiment of the present disclosure, the electronic device 100 or the OPC module 200 may perform correction in an intermediate image that is not pixelated. Accordingly, the occurrence of various defects including the above-described defects is prevented.

Figure 3:
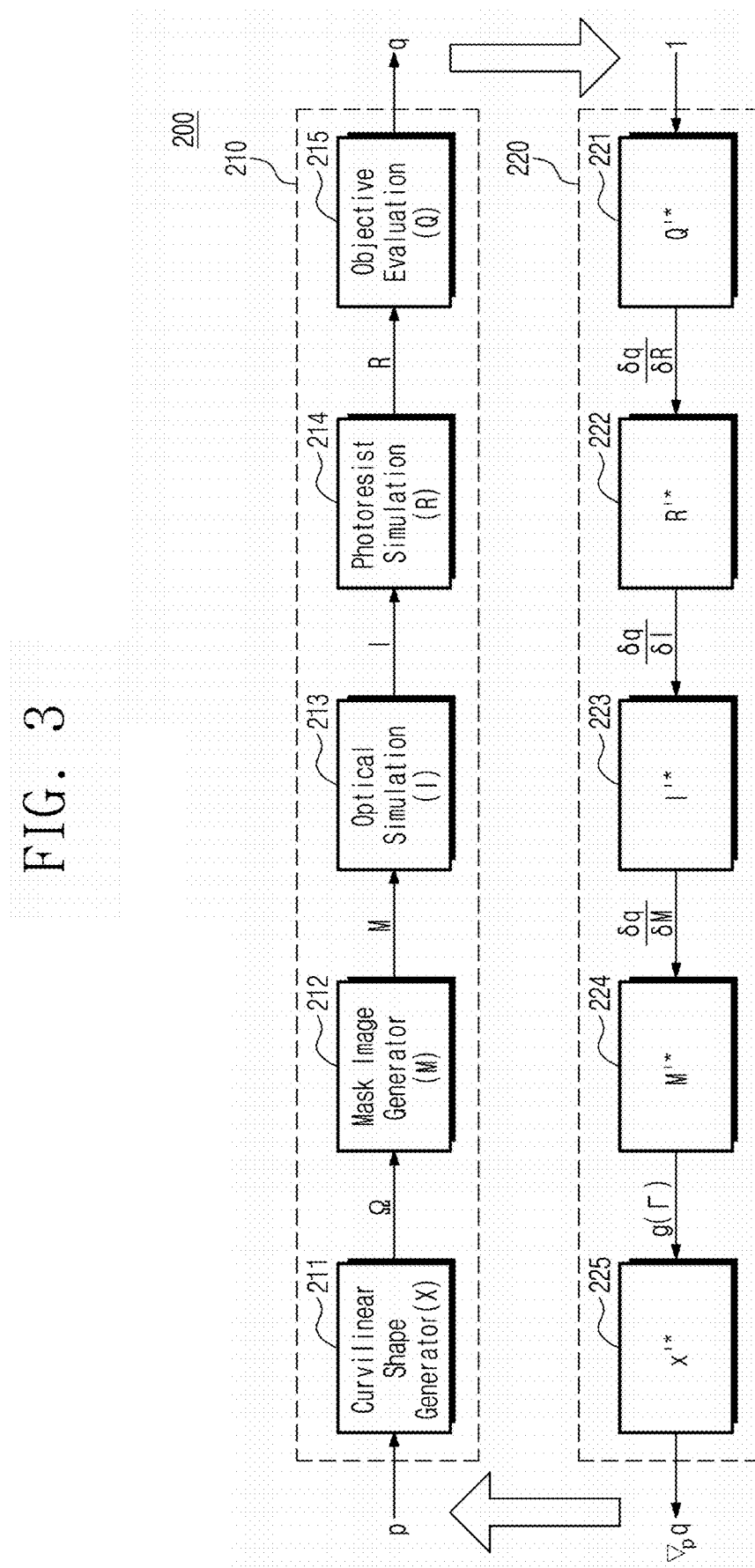
FIG. 3 illustrates an implementation example of an optical proximity correction (OPC) module.

FIG. 3 illustrates an implementation example of the OPC module 200. Referring to FIGS. 1, 2, and 3, the OPC module 200 may include a forward unit 210 that performs a forward operation and a backward unit 220 that performs a backward operation. In an embodiment, a component that generates an intermediate image from a layout image is not illustrated in FIG. 3.

The forward unit 210 may receive the intermediate image "p". The forward unit 210 may perform simulation and evaluation on the intermediate image "p" to generate a slope "q". For example, the slope "q" may indicate a slope of a change in intensities of lights reaching a semiconductor wafer when the intermediate image "p" is used as a photomask. For example, the slope "q" may indicate a slope of a change in the intensity of light at a boundary of each of main features.

When the slope "q" of a change in the intensity of light at a boundary of each of main features increases, a difference of the intensity of light projected onto a portion where a photoresist should be generated and the intensity of light projected onto a portion where a photoresist should not be generated may increase. That is, as the slope "q" becomes greater, generated photoresist patterns may become clearer and more accurate, and thus, a process margin may be improved.

The backward unit 220 may receive a target slope (e.g., "1"). The backward unit 220 may reversely perform the forward operation of the forward unit 210 based on the target slope (e.g., "1"), for example, may perform a backward operation. The backward unit 220 may perform the backward operation to calculate correction information $\nabla_p q$ for correction of an intermediate image.

By repeating the forward operation of the forward unit 210, the backward operation of the backward unit 220, and the correction of the intermediate image, the electronic device 100 or the OPC module 200 may optimizing a shape of a photomask and may increase a process margin.

The forward unit 210 may include a curvilinear shape generator 211, a mask image generator 212, an optical simulation block 213, a photoresist simulation block 214, and a target evaluation block 215. The curvilinear shape generator 211, the mask image generator 212, the optical simulation block 213, the photoresist simulation block 214, and/or the target evaluation block 215 may be implemented with hardware, software, or a combination of hardware and software.

The curvilinear shape generator 211 may calculate a curvilinear shape image $\Omega$ from the intermediate image "p". For example, depending on the way to implement, the curvilinear shape generator 211 may generate the curvilinear shape image $\Omega$ by using various methods.

Figure 6:
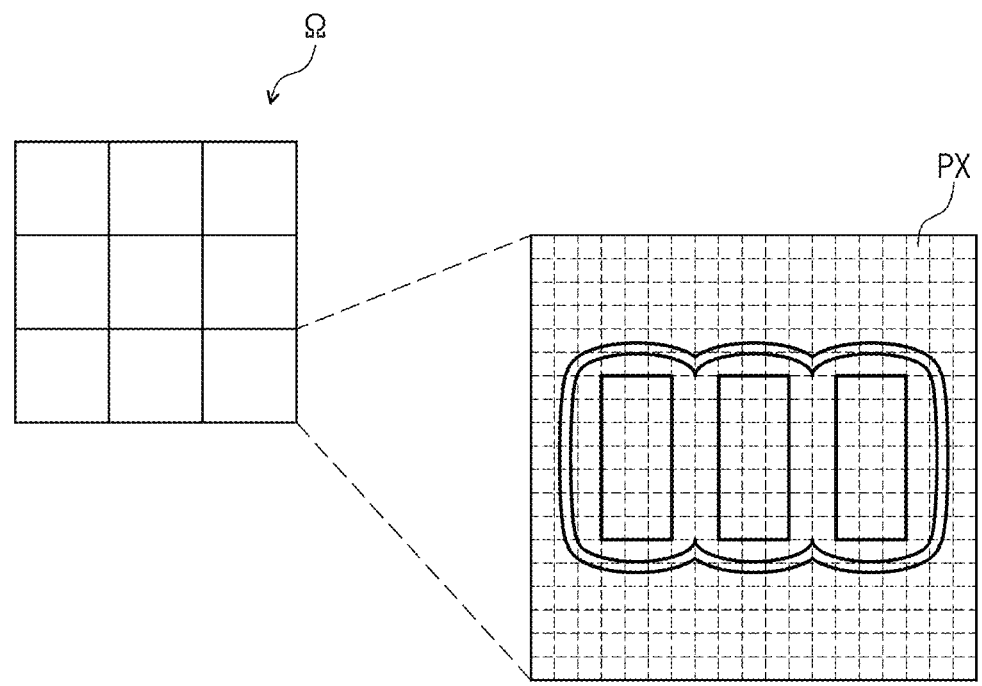
FIG. 6 illustrates an example in which pixelation is performed.

The mask image generator 212 may pixelate the curvilinear shape image $\Omega$ to generate a mask image "M". An example of a process in which pixelation is performed is illustrated in FIG. 6. Referring to FIG. 6, the curvilinear shape image $\Omega$ may be divided into a plurality of areas, and pixelation may be performed on main features and assist features of each of the plurality of areas.

Each of the plurality of areas of the curvilinear shape image $\Omega$ may be divided into pixels PX. The pixels PX may have the same sizes. A resolution of the pixels PX may be lower than a resolution of data of the layout image LI or a resolution of data of the curvilinear shape image $\Omega$.

Each of the pixels PX may have a value between 0 and 1 (e.g., a normalized value). The mask image generator 212 may calculate values of the pixels PX of the mask image "M" based on Equation 1 below.

$$\mathcal{M}(x) = \int_\Omega dx' f(x,x') \qquad \text{[Equation 1]}$$

In Equation 1, x' and x may represent a location on a pixel of an intermediate image and may respectively indicate values on a two-dimensional coordinate system based on the pixels PX. $f(x,x')$ may be a filter function. When the mask image "M" is a thin (e.g., two-dimensional) mask, the filter function $f(x,x')$ may be an anti-aliasing filter. When the mask image "M" is a thick (e.g., three-dimensional) mask, the filter function $f(x,x')$ may be an edge filter or a coupling filter.

Figure 7:
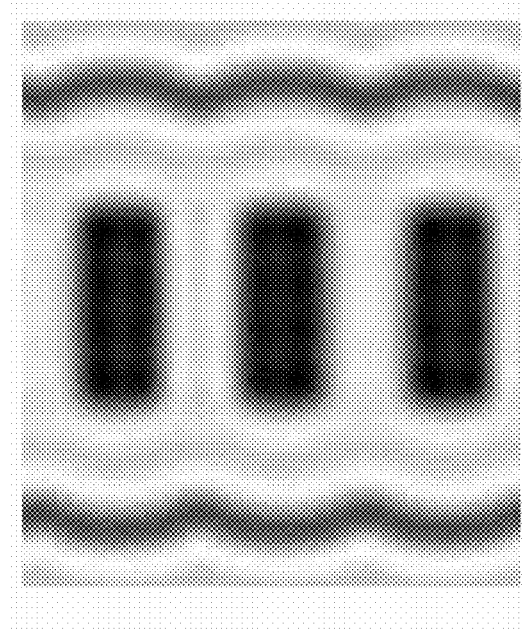
FIG. 7 illustrates an example in which pixelation is completed.

An example in which pixelation is completed is illustrated in FIG. 7. Referring to FIG. 7, a resolution of the mask image "M" that is generated after the pixelation is completed may decrease.

Referring again to FIGS. 1, 2, and 3, the optical simulation block 213 may perform optical simulation based on the mask image "M" and may calculate an optical image "I" to be projected on the semiconductor wafer. The photoresist simulation block 214 may perform photoresist simulation based on the optical image "I" and may calculate a photoresist image "R" to be formed on the semiconductor wafer.

The target evaluation block 215 may perform evaluation based on the photoresist image "R" and may calculate the slope "q".

The backward unit 220 may include a first block 221, a second block 222, a third block 223, a fourth block 224, and a fifth block 225.

The first block 221 may calculate a Frechet derivative Q'* based on the target slope (e.g., "1") and computation of the target evaluation block 215 and may output a change $$\frac{\delta q}{\delta R}$$

in a target slope of a change in the intensity of light to change in a photoresist image as an adjoint variable.

The second block 222 may calculate a Frechet derivative R'* based on the change $$\frac{\delta q}{\delta R}$$

in a target slope of a change in the intensity of light to change in a photoresist image and computation of the photoresist simulation block 214 and may output a change $$\frac{\delta q}{\delta R}$$

in a target slope of a change in the intensity of light to change in an optical image as an adjoint variable.

The third block 223 may calculate a Frechet derivative I'* based on a change $$\frac{\delta q}{\delta I}$$

in a target slope of a change in the intensity of light to change in an optical image and computation of the optical simulation block 213 and may output a change $$\frac{\delta q}{\delta M}$$

in a target slope of a change in the intensity of light to change in a mask image as an adjoint variable.

In an embodiment, the change $\delta \mathcal{M}$ of a mask image, for example, a shape derivative $\delta \mathcal{M}$ of the mask image "M" may be derived to Equation 2 based on Equation 1.

$$\delta \mathcal{M}\,(\Omega,v(x'))(x) = \int_{\partial\Omega} dx' f(x,x') v(x') \cdot \hat{n} \quad \text{[Equation 2]}$$

In Equation 2, $\partial\Omega$ may represent a boundary line of the curvilinear shape image $\Omega$. $\hat{n}$ may a normal vector of each of points (or pixels) belonging to the boundary line of the curvilinear shape image $\Omega$. v(x') may indicate a location movement of each of points (or pixels) belonging to the boundary line of the curvilinear shape image $\Omega$. As understood from Equation 2, the shape derivative $\delta \mathcal{M}$ of the mask image "M" may be calculated at the boundary line of the curvilinear shape image $\Omega$ (or the pixels PX of the boundary line).

The change $\delta q$ in the target slope of the intensity of light, that is, a target derivative $\delta q$ may be defined by Equation 3 based on a chain rule.

$$\delta q(\Omega, v) = \int dx \frac{\delta q}{\delta M}(x) \int_{\partial\Omega} dx' f(x, x') v(x') \cdot \hat{n} \quad \text{[Equation 3]}$$

Equation 3 may be changed to Equation 4 by changing an integration order of Equation 3.

$$\delta q(\Omega, v) = \int_{\partial\Omega} dx' v(x') \cdot \hat{n} \left[ \int dx \frac{\delta q}{\delta M}(x) f(x, x') \right] \quad \text{[Equation 4]}$$

Figure 8:
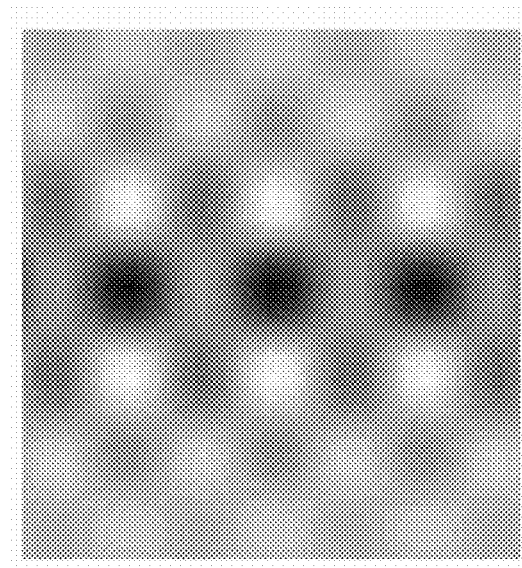
FIG. 8 illustrates a change in a target slope of a change in the intensity of light to a change in a mask image, in the shape of an image.

The change $$\frac{\delta q}{\delta M}$$

in the target slope of the change in the intensity of light to the change of the mask image may be expressed in the shape of an image like FIG. 8. In FIG. 8, as a boundary line of main features or assist features becomes closer to a bright portion, the slope "q" of the change in the intensity of light may increase; as a boundary line of main features or assist features becomes closer to a dark portion, the slope "q" of the change in the intensity of light may decrease.

Referring again to FIGS. 1, 2, and 3, the fourth block 224a may calculate a Frechet derivative (M'*) based on a change $$\frac{\delta q}{\delta M}$$

in a target slope of a change in the intensity of light to a change in a mask image and computation of the mask image generator 212 and may output a change $g(\Gamma)$ in a target slope of a change in the intensity of light to a change in a curvilinear shape image (e.g., may output a shape gradient) as an adjoint variable. The change ($g(\Gamma)$) in the target slope of the change in the intensity of light to the change in the curvilinear shape image may be calculated by Equation 5.

$$g(\Gamma) = M'^* \left( \frac{\delta q}{\delta M} \right)(x') = \int dx \frac{\delta q}{\delta M}(x) f(x, x') \quad \text{[Equation 5]}$$

The fifth block 225 may calculate a Frechet derivative x'* based on the change $g(\Gamma)$ in the target slope of the change in the intensity of light to the change in the curvilinear shape image and computation of the curvilinear shape generator 211 and may output correction information $\nabla_p q$ for correction of an intermediate image as an adjoint variable. The correction information $\nabla_p q$ for correction of an intermediate image may be calculated by Equation 6.

$$\nabla_p q = x'^* 0 g(\Gamma), v) = \int_{\partial\Omega} dx' v(x') \times \hat{n} g(\Gamma) \delta \mathcal{M}\,(\Omega, v(x'))(x) \quad \text{[Equation 6]}$$

Figure 9:
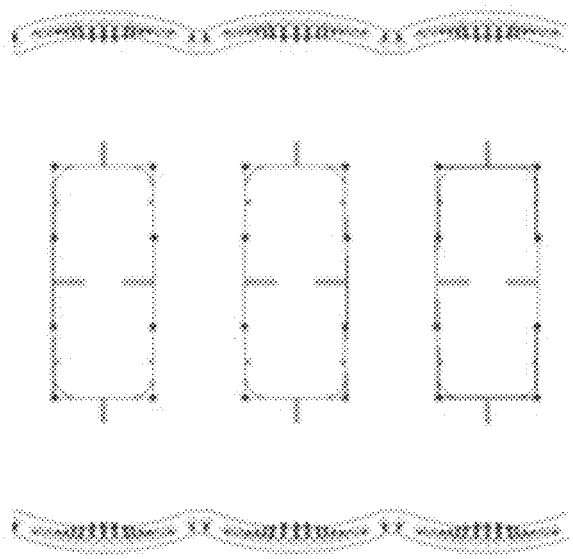
FIG. 9 illustrates correction information for correction of an intermediate image in the shape of an image.

The correction information $\nabla_p q$ for correction of an intermediate image may be expressed in the shape of an image like FIG. 9. In FIG. 9, circular shapes may indicate points defining the curvilinear shape image $\Omega$. Lines extending from the circular shapes indicate correction locations of the points defining the curvilinear shape image $\Omega$.

The electronic device 100 or the OPC module 200 may correct the points defining the curvilinear shape image Ω, based on the correction information $\nabla_p q$ for correction of an intermediate image. The correction of the intermediate image may be calculated by Equation 7, based on a gradient descent.

$$p_{i+1} = p_i - \eta \nabla_p q|_{p=p_i} \quad \text{[Equation 7]}$$

In Equation 7, i may be a positive integer and may indicate the number of times of a loop including the forward operation of the forward unit 210, the backward operation of the backward unit 220, and the correction of the intermediate image. η may be a constant and may be determined randomly or based on a process characteristic.

Figure 10A:
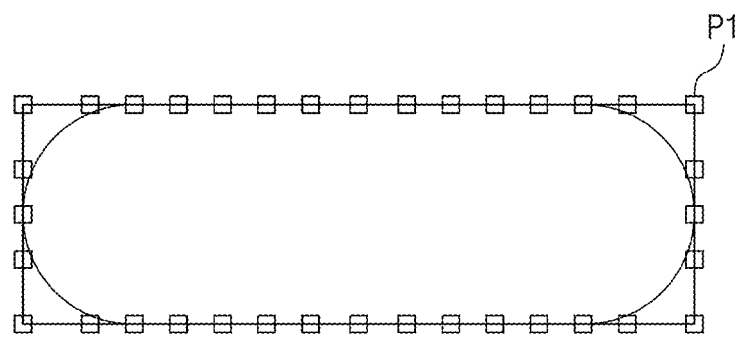
FIG. 10A illustrates a first embodiment in which a curvilinear shape image is defined.

FIG. 10A illustrates a first embodiment in which the curvilinear shape image Ω is defined. Referring to FIGS. 3 and 10A, the electronic device 100 or the OPC module 200 may set first points P1 at a boundary line of a main feature of the intermediate image "p". The electronic device 100 or the OPC module 200 may parameterize the intermediate image "p" into the first points P1. The curvilinear shape generator 211 may generate a curve inscribed in a boundary line connecting the first points P1 as the curvilinear shape image Ω.

Figure 10B:
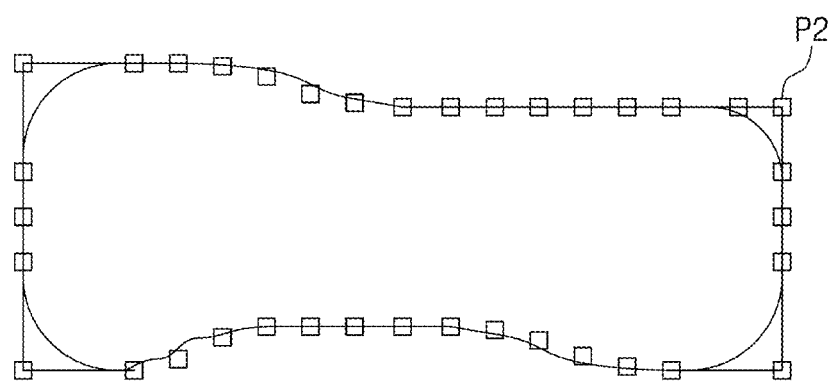
FIG. 10B illustrates an example in which an intermediate image is corrected based on a curvilinear shape image defined like FIG. 10A.

FIG. 10B illustrates an example in which the intermediate image "p" is corrected based on the curvilinear shape image Ω defined like FIG. 10A. Referring to FIGS. 3, 10A, and 10B, the electronic device 100 or the OPC module 200 may correct locations of the first points P1 to second points P2. The curvilinear shape generator 211 may generate a curve inscribed in a boundary line connecting the second points P2 as the curvilinear shape image Ω.

Figure 11A:
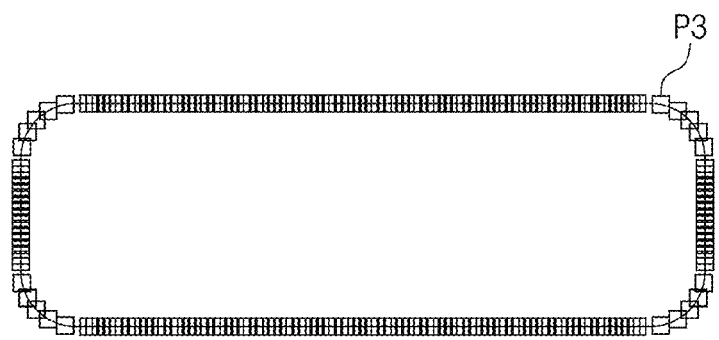
FIG. 11A illustrates a second embodiment in which a curvilinear shape image is defined.

FIG. 11A illustrates a second embodiment in which the curvilinear shape image Ω is defined. Referring to FIGS. 3 and 11A, the electronic device 100 or the OPC module 200 may set third points P3 at a boundary line of a main feature of the intermediate image "p". The electronic device 100 or the OPC module 200 may parameterize the intermediate image "p" into the third points P3. The curvilinear shape generator 211 may generate a curve connecting the third points P3 as the curvilinear shape image Ω.

Figure 11B:
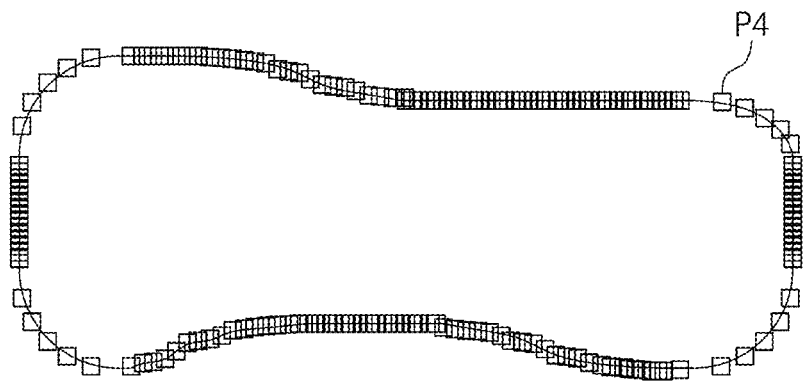
FIG. 11B illustrates an example in which an intermediate image is corrected based on a curvilinear shape image defined like FIG. 11A.

FIG. 11B illustrates an example in which the intermediate image "p" is corrected based on the curvilinear shape image Ω defined like FIG. 11A. Referring to FIGS. 3, 11A, and 11B, the electronic device 100 or the OPC module 200 may correct locations of the third points P3 to fourth points P4. The curvilinear shape generator 211 may generate a curve connecting the fourth points P4 as the curvilinear shape image Ω.

Figure 12:
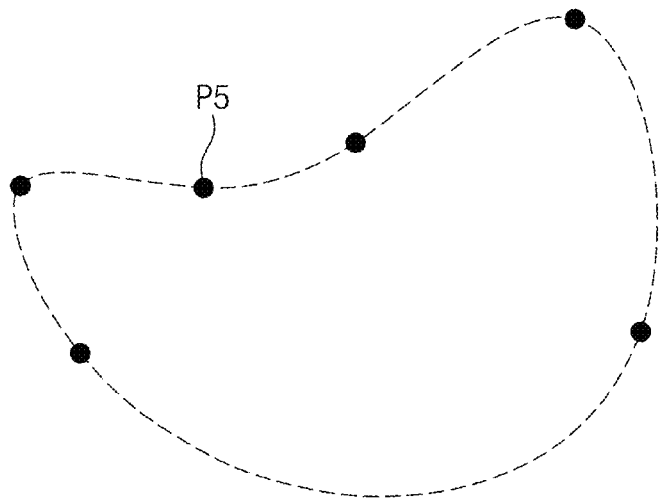
FIG. 12 illustrates a third embodiment in which a curvilinear shape image is defined.

FIG. 12 illustrates a third embodiment in which the curvilinear shape image Ω is defined. Referring to FIGS. 3 and 12, the electronic device 100 or the OPC module 200 may set fifth points P5 from a boundary line of a main feature of the intermediate image "p". The electronic device 100 or the OPC module 200 may parameterize the intermediate image "p" into the fifth points P5. The curvilinear shape generator 211 may generate the curvilinear shape image Ω based on the fifth points P5 and a spline curve function.

As described with reference to FIGS. 10A, 10B, 11A, and 11B, the electronic device 100 or the OPC module 200 may correct locations of the fifth points P5. The curvilinear shape generator 211 may generate the curvilinear shape image Ω based on the fifth points P5 and the spline curve function.

Figure 13:
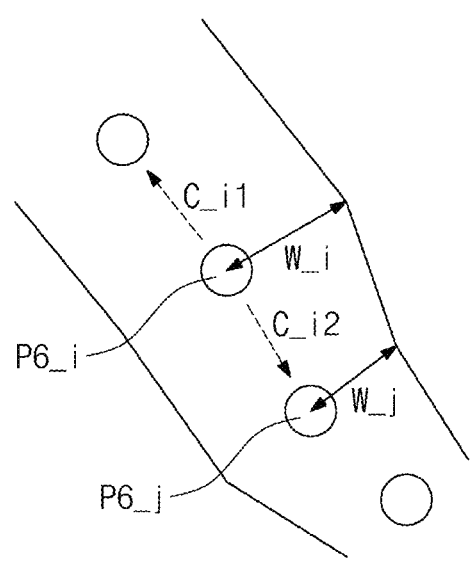
FIG. 13 illustrates a fourth embodiment in which a curvilinear shape image is defined.

FIG. 13 illustrates a fourth embodiment in which the curvilinear shape image Ω is defined. Referring to FIGS. 3 and 13, the electronic device 100 or the OPC module 200 may set sixth points (including P6_i and P6_j) on the center of the interior defined by boundary lines of an assist feature of the intermediate image "p". The electronic device 100 or the OPC module 200 may parameterize the intermediate image "p" into the sixth points (including P6_i and P6_j).

The electronic device 100 and the OPC module 200 may tag width information (e.g., W_i with respect to P6_i or W_j with respect to P6_j) and at least one point identifier information (e.g., C_i1 and C_i2 with respect to P6_i) on each of the sixth points. The at least one point identifier information may indicate at least one point that is the closest thereto and connected thereto to forms a continuous assist feature. The width information may include information of a width in a normal direction from each point to a boundary of an assist feature. The curvilinear shape generator 211 may generate the curvilinear shape image Ω based on the width information and point identifier information of the sixth points.

As described with reference to FIGS. 10A, 10B, 11A, and 11B, the electronic device 100 or the OPC module 200 may correct locations of the sixth points P6. Also, the electronic device 100 or the OPC module 200 may correct the width information tagged on the sixth points P6. The curvilinear shape generator 211 may generate the curvilinear shape image Ω based on the width information and point identifier information of the sixth points.

In an embodiment, for optimization of the intermediate image "p", a movement of the locations of the sixth points P6 may be restricted in the normal direction.

According to an embodiment of the present disclosure, photomask patterns are expressed in a curvilinear shape, and a photomask pattern is corrected by directly correcting the curvilinear shape. Accordingly, because the correction of the curvilinear shape is not performed in a pixelated state, the occurrence of various defects such as a consistency defect, a mask rule constraints (MRC) defect, and a boundary defect is prevented.

What is claimed is:

1. An operating method of an electronic device for manufacture of a semiconductor device, the method comprising:
   receiving a layout image of the semiconductor device;
   generating an intermediate image by generating assist features based on main features of the layout image;
   evaluating a process result by performing simulation based on the intermediate image; and
   correcting the intermediate image by correcting shapes of the main features and/or the assist features of the intermediate image based on the process result,
   wherein the correcting of the intermediate image is performed reversely to the evaluating of the process result to generate correction information of the intermediate image, and
   wherein the correcting of the intermediate image is performed based on a target slope of a change in an intensity of light and a slope of a change in the intensity of light at a boundary of each of main features obtained from the evaluating of the process result.

2. The method of claim 1,
   wherein the evaluating and the correcting are repeated until a corrected result of the intermediate image is matched with the layout image.

3. The method of claim 1,
   wherein the evaluating includes:
      generating a curvilinear shape image from the intermediate image;
      generating a mask image by pixelating the curvilinear shape image;

generating an optical image by performing optical simulation on the mask image;
generating a photoresist image by performing photoresist simulation on the optical image; and
evaluating the process result based on the photoresist image.

4. The method of claim 3,
wherein the generating of the curvilinear shape image includes:
generating a curve inscribed in an outer line connecting points of each of the main features as an element of the curvilinear shape image corresponding to each of the main features.

5. The method of claim 4,
wherein the correcting of the intermediate image includes:
adjusting a location of at least one of the points.

6. The method of claim 3, further comprising:
generating a curve connecting points of each of the main features as an element of the curvilinear shape image corresponding to each of the main features.

7. The method of claim 6,
wherein the correcting of the intermediate image includes:
adjusting a location of at least one of the points.

8. The method of claim 3,
wherein the generating of the curvilinear shape image includes:
generating a curve, which is generated based on a spline curve function from points of each of the main features, as an element of the curvilinear shape image corresponding to each of the main features.

9. The method of claim 8,
wherein the correcting of the intermediate image includes:
adjusting a location of at least one of the points.

10. The method of claim 3,
wherein the generating of the curvilinear shape image includes:
at points of an interior of each of the assist features, connecting points based on at least one point identifier information tagged on each point and generating boundary lines, which are based on width information of each of the connected points, as an element of the curvilinear shape image.

11. The method of claim 10,
wherein the correcting of the intermediate image includes:
adjusting at least one of location and width information of at least one point of the points.

12. The method of claim 1,
wherein the evaluating of the process result includes:
calculating a slope of a change in the intensity of light at a boundary line of each of the main features.

13. The method of claim 1,
wherein the correcting of the intermediate image includes:
calculating a change in a target slope of a change in the intensity of light to a change in a photoresist image, from a target slope of a change in the intensity of light at a boundary line of each of the main features;
calculating a change in a target slope of a change in the intensity of light to a change in an optical image, from the change in the target slope of the change in the intensity of light to the change in the photoresist image;
calculating a change in a target slope of a change in the intensity of light to a change in a mask image, from the change in the target slope of the change in the intensity of light to the change in the optical image;
calculating a change in a target slope of a change in the intensity of light to a change in a curvilinear shape image, from the change in the target slope of the change in the intensity of light to the change in the mask image; and
calculating the correction information of the intermediate image, from the change in the target slope of the change in the intensity of light to the change in the curvilinear shape image.

14. The method of claim 13,
wherein the change in the target slope to the change in the photoresist image, the change in the target slope to the change in the optical image, the change in the target slope to the change in the mask image, the change in the target slope to the change in the curvilinear shape image, and the correction information of the intermediate image are calculated based on a Frechet derivative.

15. An operating method of an electronic device for manufacture of a semiconductor device, the method comprising:
calculating a change in a target slope of a change in an intensity of light to a change in a photoresist image, based on simulation and an evaluation result based on a layout image including main features and assist features, from a target slope of a change in the intensity of light at a boundary line of each of the main features;
calculating a change in a target slope of a change in the intensity of light to a change in an optical image, from the change in the target slope of the change in the intensity of light to the change in the photoresist image;
calculating a change in a target slope of a change in the intensity of light to a change in a mask image, from the change in the target slope of the change in the intensity of light to the change in the optical image;
calculating a change in a target slope of a change in the intensity of light to a change in a curvilinear shape image, from the change in the target slope of the change in the intensity of light to the change in the mask image; and
calculating correction information of an intermediate image, from the change in the target slope of the change in the intensity of light to the change in the curvilinear shape image.

16. The method of claim 15,
wherein the main features respectively include photomask patterns for the manufacture of the semiconductor device,
wherein the assist features are used to assist generation of the main features, and
wherein each of the assist features is expressed by points, a distance from each point to a boundary line the which is closest thereto in a normal direction, and at least one point adjacent to each point.

17. The method of claim 16,
wherein the correction information includes a distance for moving at least one of points of at least one of the assist features in the normal direction.

18. The method of claim 16,
wherein the correction information includes a correction value of a distance from at least one of points of at least one of the assist features to a boundary line which is closest thereto in the normal direction.

19. An operating method of an electronic device for manufacture of a semiconductor device, the method comprising:
receiving a layout image of the semiconductor device;
generating an intermediate image by generating assist features based on main features of the layout image;

generating a curvilinear shape image from the intermediate image;

generating a mask image by pixelating the curvilinear shape image;

generating an optical image by performing optical simulation on the mask image;

generating a photoresist image by performing photoresist simulation on the optical image;

calculating a slope of a change in an intensity of light at a boundary line of each of the main features;

calculating a change in a target slope of a change in the intensity of light to a change in a photoresist image, from a target slope of a change in the intensity of light at the boundary line of each of the main features;

calculating a change in a target slope of a change in the intensity of light to a change in an optical image, from the change in the target slope of the change in the intensity of light to the change in the photoresist image;

calculating a change in a target slope of a change in the intensity of light to a change in a mask image, from the change in the target slope of the change in the intensity of light to the change in the optical image;

calculating a change in a target slope of a change in the intensity of light to a change in a curvilinear shape image, from the change in the target slope of the change in the intensity of light to the change in the mask image; and calculating correction information of the intermediate image, from the change in the target slope of the change in the intensity of light to the change in the curvilinear shape image.

\* \* \* \* \*